(12) United States Patent
Hamada

(10) Patent No.: US 6,363,500 B1
(45) Date of Patent: Mar. 26, 2002

(54) DEVICE AND METHOD FOR OUTPUTTING POSITIONAL INFORMATION FOR LSI CELLS AND RECORDING MEDIUM FOR POSITIONAL INFORMATION OUTPUT PROGRAM FOR LSI CELLS

(75) Inventor: Takehiko Hamada, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/189,022

(22) Filed: Nov. 10, 1998

(30) Foreign Application Priority Data

Nov. 10, 1997 (JP) .............................. 9-307712

(51) Int. Cl.<sup>7</sup> .............................................. G06F 11/00
(52) U.S. Cl. .......................................... 714/25; 365/201
(58) Field of Search .............................. 714/25, 26, 27, 714/31, 32, 33, 37, 38, 45, 46; 365/201; 382/149, 243, 126, 130

(56) References Cited

U.S. PATENT DOCUMENTS

| | | | | |
|---|---|---|---|---|
| 4,482,952 A | * | 11/1984 | Akagi | 364/200 |
| 4,748,335 A | * | 5/1988 | Lindow et al. | 250/572 |
| 5,805,446 A | * | 9/1998 | Hatakeyama et al. | 364/148 |
| 5,808,943 A | * | 9/1998 | Sato et al. | 365/200 |
| 6,031,607 A | * | 2/2000 | Miyazaki | 356/237.1 |
| 6,041,006 A | * | 3/2000 | Tsuchiya | 365/210 |
| 6,058,495 A | * | 5/2000 | Lee et al. | 714/718 |
| 6,185,324 B1 | * | 2/2001 | Ishihara et al. | 382/149 |
| 6,188,323 B1 | * | 2/2001 | Rosenquist et al. | 340/686.5 |
| 6,192,494 B1 | * | 2/2001 | Sugimoto | 714/718 |

OTHER PUBLICATIONS

Ogino et al., Method of testing semiconductor devices, JPAB, JP403174738A, p. 1–1, Jul. 1991.*
Yoshiharu et al., Method and apparatus for inspection of semiconductor devices, JPAB, JP406181244A, p. 1–1, Jun. 1994.*
Masayuki et al., Analysis system for defect of semiconductor memory and defective cell display output method, JPAB, JP404289477A, p. 1–1, Oct. 1992.*
"Testing for Single Stuck Faults", IEEE Press, New York, pp. 186–189, 1990.

* cited by examiner

Primary Examiner—Nadeem Iqbal
(74) Attorney, Agent, or Firm—Scully, Scott, Murphy & Presser

(57) ABSTRACT

In displaying positional information on a fail cell or the like after a test on a semiconductor memory with a memory tester, an address conversion section of PC converts, based on positional information obtained from the memory tester, one address array information to a plurality of types of address array information of a logical address and an capacity section address, and a display section displays the positional information based on the plurality of types of address array information. This enables the state of a fail cell to be easily understood, contributing to improved efficiency of fault analysis.

12 Claims, 5 Drawing Sheets

PHYSICAL ADDRESS

CAPACITY SECTION ADDRESS

PHYSICAL ADDRESS

CAPACITY SECTION ADDRESS

PHYSICAL ADDRESS

CAPACITY SECTION ADDRESS

DEVICE AND METHOD FOR OUTPUTTING POSITIONAL INFORMATION FOR LSI CELLS AND RECORDING MEDIUM FOR POSITIONAL INFORMATION OUTPUT PROGRAM FOR LSI CELLS

FIELD OF THE INVENTION

The invention relates to a device and a method for outputting positional information for LSI cells and a recording medium for a positional information output program for LSI cells. More particularly, the invention relates to a positional information output device for LSI cells that outputs, as a fault analysis system for a memory, positional information on a fail cell, a method for outputting the positional information, and a recording medium for a positional information output program for LSI cells.

BACKGROUND OF THE INVENTION

In fault analysis of semiconductor recording devices, such as DRAM (dynamic random access memory) and SRAM (static random access memory), the first step to be done is generally to identify a fail memory cell based on the evaluation of electrical characteristics by means of a memory tester or the like.

Outputting bit maps, such as physical addresses and logical addresses, have hitherto been carried out as a method for detecting and displaying the position of a fail memory cell at a high speed. Up to now, various methods have been proposed in order to improve the visibility of the output of the bit map and to more rapidly and more easily conduct address conversion between the physical address and the logical address.

In order to realize display of a bit map close to an actual device, for example, Japanese Patent Laid-Open No. 105544/1981 has proposed a system fault analyzing method wherein a physical address and a logical address are recorded as a pair, Japanese Patent Laid-Open No. 131470/1989 has proposed an LSI fault analyzer that displays, as layout display, simulation results in comparison with an actual device, and Japanese Patent Laid-Open No. 278556/1992 has proposed an LSI appearance fault analyzing system wherein a fault from an appearance tester is put on a bit map.

On the other hand, in order to facilitate conversion from the logical address to the physical address, for example, Japanese Patent Laid-Open No. 43429/1995 has proposed a physical address conversion circuit wherein address conversion is carried out using a hardware.

The conventional positional information output device for LSI cells will be briefly explained with reference to a fault analysis system for a semiconductor memory, by way of example, proposed in Japanese Patent Laid-Open No. 289477/1992.

A fail bit analyzing system comprises a memory tester, a positional information section for a fail memory cell, and a substantial address array conversion section. The memory tester detects electrical positional information on a fault analysis memory cell, and the positional information section for a fail memory cell stores the information in a logical address space. In the substantial address array conversion section, the fail memory cell identified by the logical address space is converted to substantial address information according to an actual layout of a semiconductor memory.

The substantial address array conversion section uses a part of layout information read from an auxiliary memory through a host CPU to perform conversion from logical address information to substantial address information.

The conventional positional information output device for LSI cells has the following problems.

Firstly, output information on the bit map is unsatisfactory for clearly understanding the state of a fail bit. This is because, in general, the output of the bit map is only for the physical address. For example, for DRAM, when a reflected bit line system is used, since the array of physical address constituted by sense AMP and word line is different from the array of the capacity section storing memory cell information, it is difficult to clearly understand the state of a fail bit through output of the physical address only. Further, for some causes of fault, display of logical address can provide more clear understanding of a fail bit than display of physical address.

Secondly, the bit map cannot be displayed by several methods.

In displaying the bit map by several methods, it is necessary to previously provide mutual address conversion formulae. The address conversion is generally expressed by Boolean algebra. Therefore, it is generally difficult to determine a function of inverse conversion.

SUMMARY OF THE INVENTION

Accordingly, it is an object of the invention to provide a positional information output device for LSI cells, a method for outputting the positional information, and a recording medium for a positional information output program for LSI cells that enable the state of a fail bit expressed by outputting a bit map to be more clearly understood at the time of a fault analysis of a semiconductor memory and, at the same time, can reduce the number of conversion formulae which should be previously provided for address conversion of the bit map.

According to the first feature of the invention, a positional information output device for LSI cells, adapted for outputting information on the position of a fail cell which has been found to be defective through an electrical test on a semiconductor memory, comprises address conversion means for converting one address array information to other address array information, permitting the positional information on a cell to be output as a plurality of types of address array information.

In the positional information output device having the above construction according to the invention, in outputting the positional information of a fail cell which has been found to be defective through an electrical test on a semiconductor memory, the address conversion means converts one address array information to other address array information, making it possible to output the positional information of the cell as a plurality of types of address information based on at least address array information before the conversion and address array information after the conversion.

It is a matter of course that when the address conversion means converts one address array information to a plurality of types of address array information, the plurality of types of address array information may be output.

For example, a conversion formula for conversion from a physical address to a logical address and a conversion formula for conversion from a physical address to an address in a capacity section storing memory cell information are provided, and the address conversion means uses the above conversion formula to output and display the positional information of a fail cell in a desired type of address.

Various types of address array information may be adopted for conversion address. For example, in the positional information output device for LSI cells, the address conversion means may convert cell information to address array information in a capacity section that stores cell information.

In this construction, in outputting the positional information of the cell as a plurality of types of address array information, the address conversion means converts cell information to address array information in a capacity section storing cell information, and the address array information in the capacity section is output.

Since the address array information in the capacity section is not always an orthogonal coordinate, in the positional information output device for LSI cells, the address conversion means may be constructed so that, in outputting the address array information in the capacity section storing the cell information, the address conversion means outputs address array information reflecting actual memory dell array form of the device.

In this construction, when the address conversion means outputs address array information in the capacity section storing cell information, the address conversion means reflects the memory cell array form of an actual device and outputs the address array information according to the form.

In the actual device, there are various memory cell array forms. For example, in the positional information output device for LSI cells, the memory cell array form may be parallelogrammic.

In this construction, since the memory cell array from is parallelogrammic, the address conversion means outputs address array information reflecting the parallelogrammic form.

In the positional information output device for LSI cells, another example of the memory cell array form may be honeycomb.

In this construction, since the memory cell array from is honeycomb, the address conversion means outputs address array information reflecting the honeycomb form.

Various methods may be adopted for the address conversion means to covert address information. For example, in the positional information output device for LSI cells, the address conversion means may be constructed so as to automatically produce an address corresponding to inverse conversion from a unidirectional conversion formula for converting one address array information to other address array information.

In this construction, in conversion from one address array information to other address array information, the address conversion means automatically produces an address corresponding to inverse conversion from the unidirectional conversion formula.

The address corresponding to the inverse conversion may be automatically produced by various methods. For example, in the positional information output device for LSI cells, the address conversion means may be constructed so that, in the automatic production of the address corresponding to the inverse conversion, the address conversion means estimates an input state from the output state in an address conversion site.

In this construction, the address conversion means estimates the input state from the output state in the address conversion site to automatically produce the address corresponding to the inverse conversion.

That is, regarding the conversion from the logical address to the physical address or from the address in the capacity section to the physical address, the address is automatically produced by using an algorithm for estimating the input state from the output state in the combinational circuit according to the above conversion formula. Therefore, there is no need to previously provide the formulae for inverse conversion.

The address array information output in this way may be actually displayed or utilized in a device in a later stage or the like. Alternatively, the positional information output device for LSI cells may further comprise display means for displaying a desired portion of a wafer in an increased or reduced screen based on the address array information.

In this construction, the display means displays a desired portion of a wafer in an increased or reduced screen based on the address array information.

In order to array a plurality of types of address information, in the positional information output device for LSI cells, the display means may be constructed so as to display, in an array form, the desired portion of the wafer based on the plurality of types of address array information.

In this construction, the display means displays, in an array form, the desired portion of the wafer based on the plurality of types of address array information.

Such address array information may be adopted in various semiconductor memories. In the positional information output device for LSI cells, the semiconductor memory may be constituted by DRAM using a reflected bit line system.

In this construction, the semiconductor memory is DRAM using a reflected bit line system, and, when the reflected bit line system is used, the array of physical address constituted by sense AMP and word line is different from the array of the capacity section storing memory cell information. However, the state of a fail bit can be clearly understood through the plurality of types of address array information.

According to the second feature of the invention, a method for outputting information for LSI cells on the position of a fail cell which has been found to be defective through an electrical test on a semiconductor memory, comprises converting one address array information to other address array information to output the positional information on a cell as a plurality of types of address array information.

The positional information output device for LSI cells may be provided alone or utilized in such a state that it is incorporated in certain equipment. The idea of the invention includes various embodiments without limitation to these only. Therefore, the positional information output device for LSI cells may be used as a software or a hardware and suitably varied. For example, in the case of a software of an image processor, the invention may be, of course, present on and utilized in a recording medium recording the software.

According to the third feature of the invention, there is provided a recording medium recording a positional information output program, for LSI cells, for outputting information on the position of a fail cell which has been found to be defective through an electrical test on a semiconductor memory, wherein the positional information output program comprises the steps of: converting one address array information to other address array information; and outputting the positional information on a cell as a plurality of types of address array information.

It is a matter of course that the recording medium may be a magnetic recording medium or an optomagnetic recording medium. This is true of any recording medium which will be developed in the future. Further, this is true of replication stages of primary replication products, secondary replication products and the like. Furthermore, the invention may be utilized through communication lines.

Furthermore, the invention may be realized by a combination of a software with a hardware. For example, the invention may be utilized in such a manner that a part may be previously recorded on a recording medium and the other part may be read according to need.

BRIEF DESCRIPTION OF THE DRAWINGS

The invention will be explained in more detail in conjunction with appended drawings, wherein.

DESCRIPTION OF THE PREFERRED EMBODIMENTS

Before explaining the positional information output device for LSI cells in the preferred embodiments, the aforementioned conventional positional information output device for LSI cells will be explained in FIG. 1.

Figure 1:
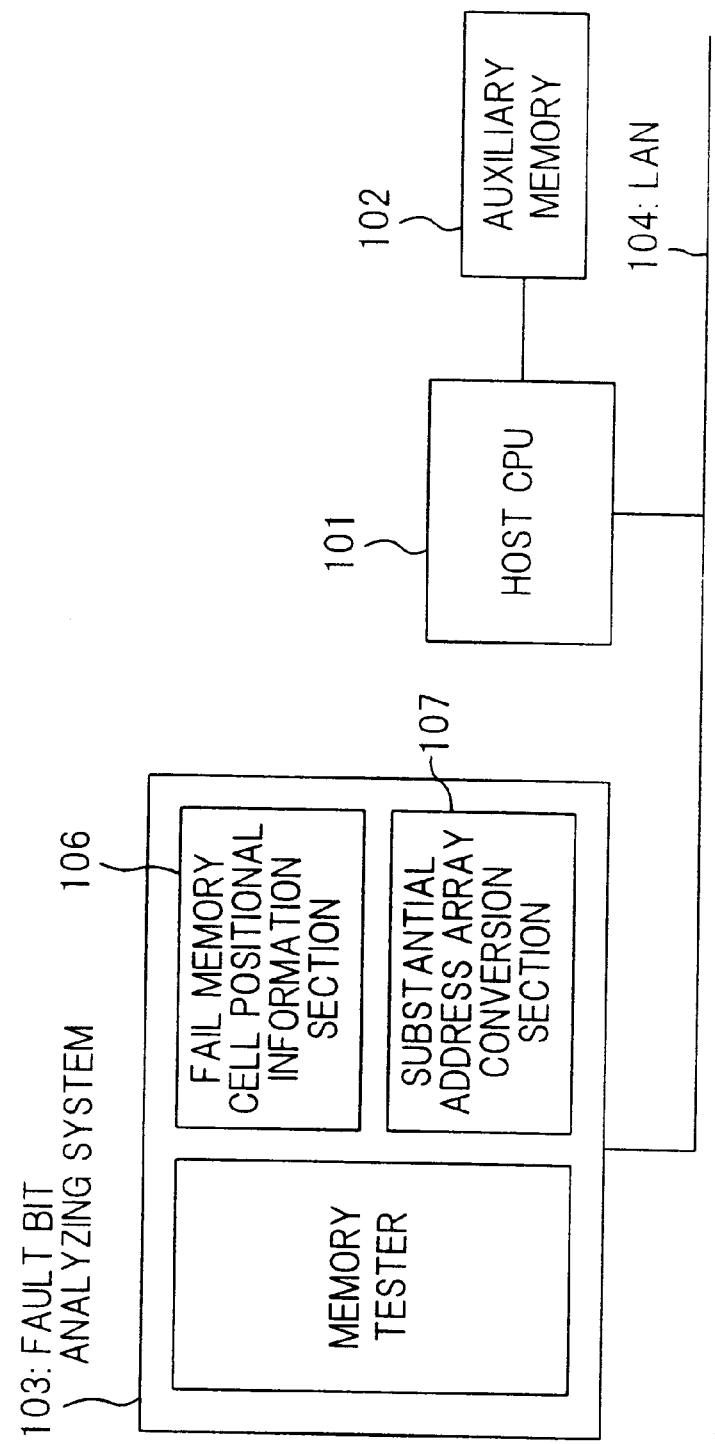
FIG. 1 is a schematic block diagram of a conventional positional information output device for LSI cells.

In FIG. 1, numeral 101 designates a host CPU comprising a large computer, numeral 102 an auxiliary memory of the host CPU, and numeral 103 a fail bit analyzing system. The host CPU 101 is connected to the fail bit analyzing system 103 through LAN (local area network) 104. The auxiliary memory 102 stores layout information on a semiconductor memory which should be subjected to a fault analysis.

A fail bit analyzing system 103 comprises a memory tester 105, a positional information section 106 for a fail memory cell, and a substantial address array conversion section 107. The memory tester 105 detects electrical positional information on a fault analysis memory cell, and the positional information section 106 for a fail memory cell stores the information in a logical address space. In the substantial address array conversion section 107, the fail memory cell identified by the logical address space is converted to substantial address information according to an actual layout of a semiconductor memory.

The substantial address array conversion section 107 uses a part of layout information read from an auxiliary memory 102 through a host CPU 101 to perform conversion from logical address information to substantial address information.

Next, the preferred embodiments of the invention will be described with reference to the accompanying drawings.

Figure 2:
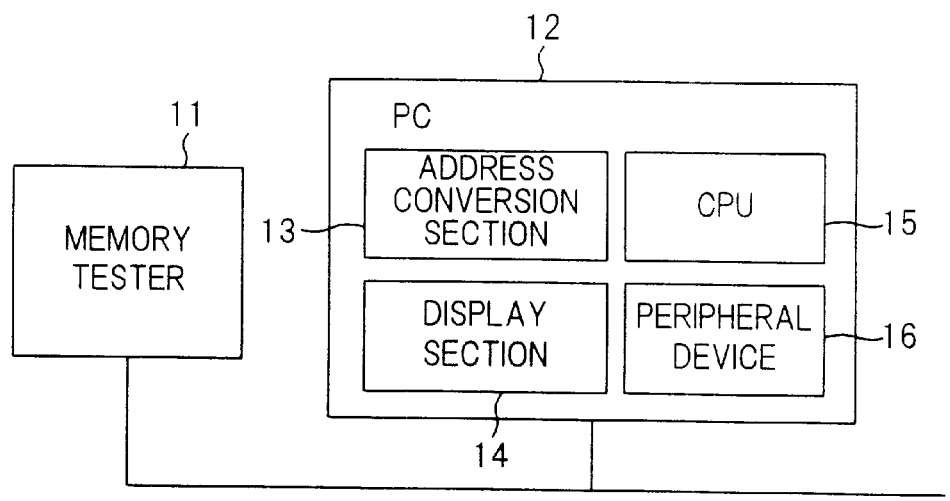
FIG. 2 is a schematic block diagram of a positional information output device for LSI cells according to a first preferred embodiment of the invention.

FIG. 2 is a block diagram showing the first preferred embodiment of the invention.

In the drawing, the memory tester 11 detects the positional information on a fail memory cell by a series of writing and reading operations according to a test pattern mainly in the step of probing where the semiconductor memory is in the form of a semiconductor wafer, and mainly in the step of screening wherein the semiconductor memory is in the form of a packaged chip.

The memory tester 11 detects and outputs the positional information of a fail memory cell, and PC (a personal computer) 12 analyzes information received from the memory tester 11.

PC 12 comprises an address conversion section 13 for converting positional information received from the memory tester 11 to desired address information, a display section 14 for displaying the converted address information on a display, CPU 15, and a peripheral device 16, such as a hard disk.

In this preferred embodiment, the address conversion section 13 is constructed as a software and previously stores formulae for conversion among three types of address information, a physical address, a logical address, and an address of a capacity section storing memory cell information. The address conversion section 13 may be provided as magnetic disks, semiconductor memories and other recording media.

The positional information output from the memory tester 11 may be a logical address or a physical address according to the test pattern used. For simplification, outputting of positional information on a physical address will be explained.

The address conversion section 13 can perform both address conversions, conversion from a logical address to a physical address and conversion from a physical address to a logical address. Therefore, it is needless to say that the above supposition does not limit embodiments of the invention.

Figure 3:
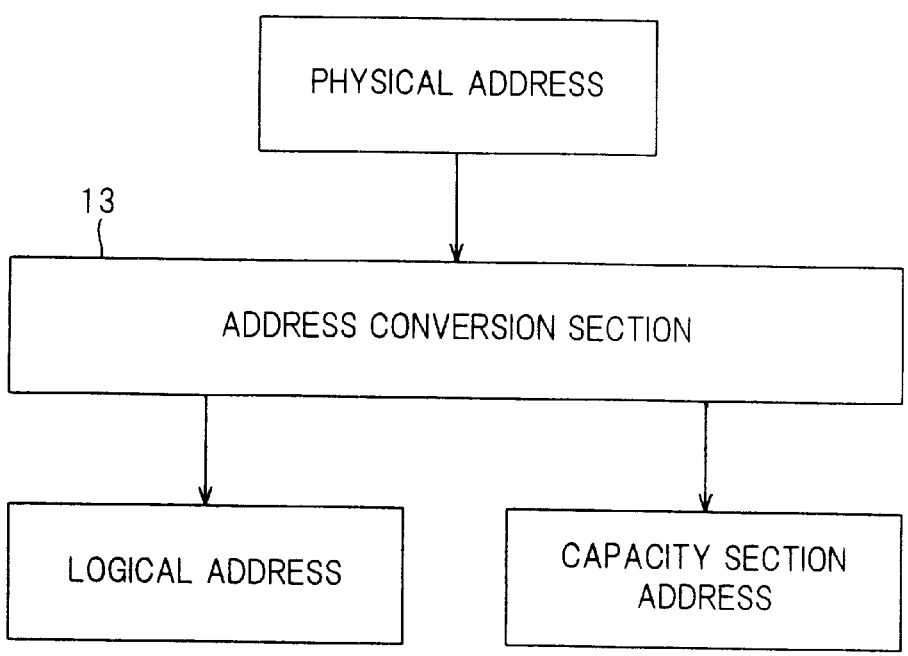
FIG. 3 is a functional block diagram illustrating the operation of an address conversion section in the positional information output device for LSI cells according to the first preferred embodiment of the invention.

FIG. 3 is a functional block diagram illustrating the operation of the address conversion section 13.

The address conversion section 13 first stores, as a bit map, physical address information on a fail memory cell received from the memory tester 11, and then prepare a bit map of the logical address and a bit map of the address in the capacity section according to the address conversion formula.

Figure 4:
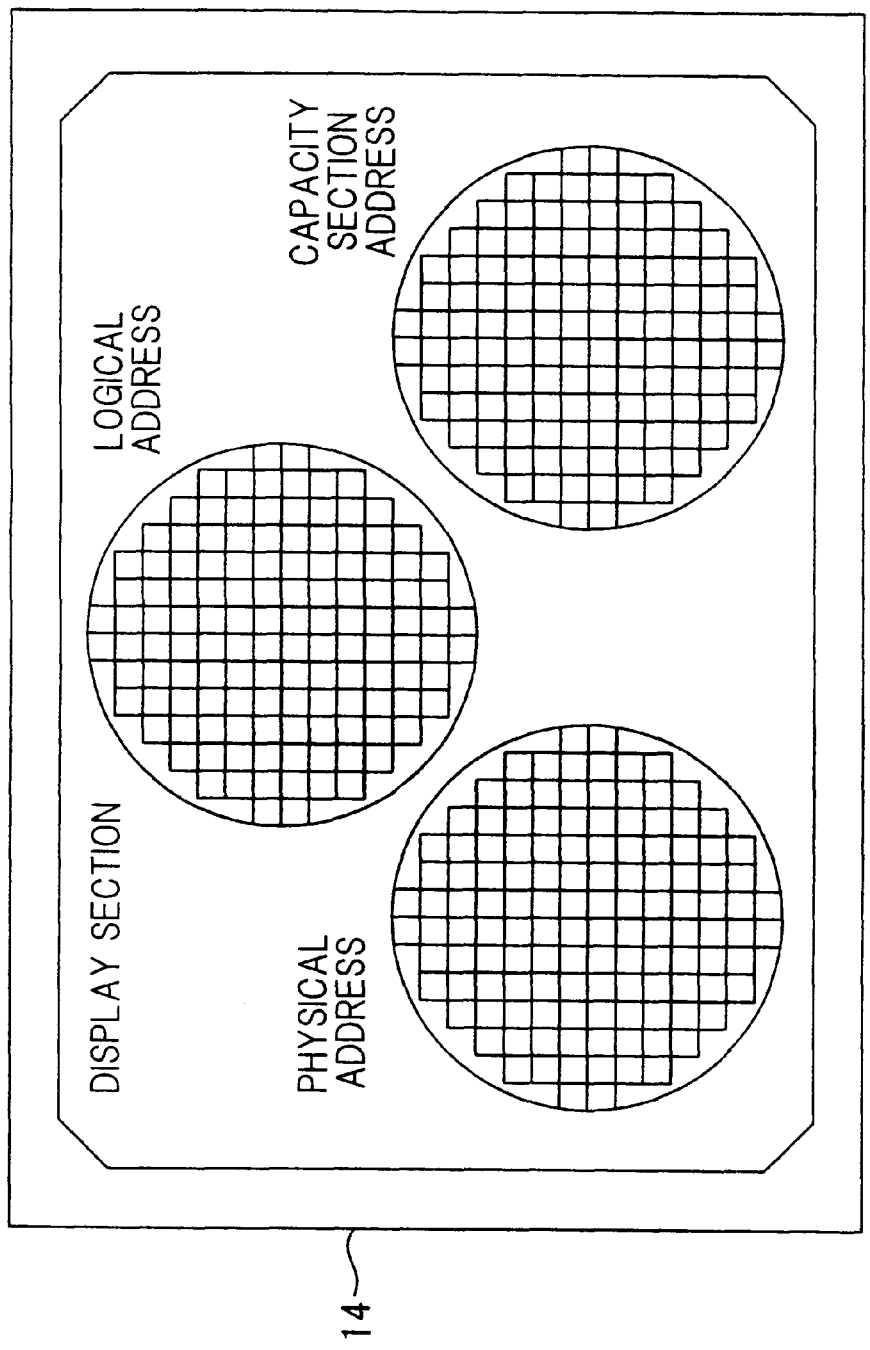
FIG. 4 is a screen image diagram of a display section in the positional information output device for LSI cells according to the first preferred embodiment of the invention.

FIG. 4 is a diagram showing an screen image displayed by the display section 14.

In PC 12, the display section 14 can display three bit maps of the state of wafer, a bit map of a physical address, a bit map of a logical address, and a bit map of an address in the capacity section. Therefore, the user may display only bit maps of respective addresses, or alternatively may display any part of the wafer as an increased screen display according to need. Further, only one target chip may be displayed in an array form, or any part thereof may be displayed as an increased screen display.

In FIG. 4, the semiconductor memory is in the form of a semiconductor wafer. When the semiconductor memory is in the form of a packaged chip, this drawing corresponds to display of only one target chip in the case of the semiconductor memory in the form of a semiconductor wafer.

PC 12 can display the bit map on the display section 14, and, in addition, can record or display a desired image on a hard disk or a peripheral device, such as a printer, or can output the desired image as data to other PC 12 through a recording medium or a communication line.

Figure 5A:
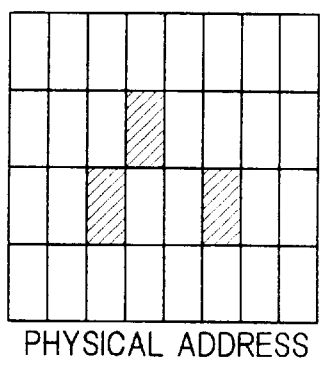
FIGS. 5A and 5B are a screen image diagram of an actual wafer.
Figure 5B:
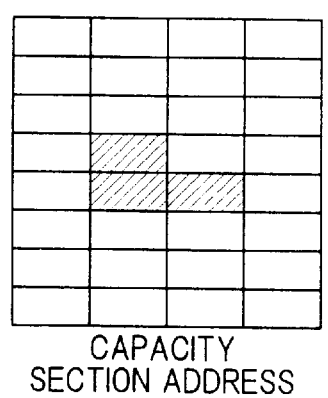

FIG. 5 is a diagram showing an image in the case of DRAM using a reflected bit line system, wherein (a) shows a physical address and (b) shows an address in a capacity section. This drawing is a diagram of an enlarged image of a chip and shows a region of 8 word lines in the longitudinal direction and 8 lines (4 sense AMPs) in the lateral direction.

In this drawing, fail bits are displayed in a black color. In the case of display of the physical address only, it is difficult to note that in the array of the capacity section, adjacent cells are defective.

Figure 6A:
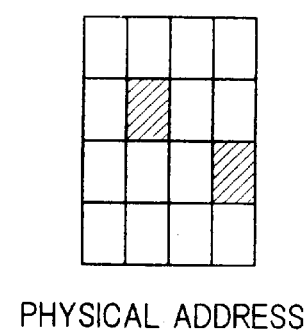
FIGS. 6A and 6B are a screen image diagram in an embodiment wherein the form of a memory cell array is parallelogrammic.
Figure 6B:
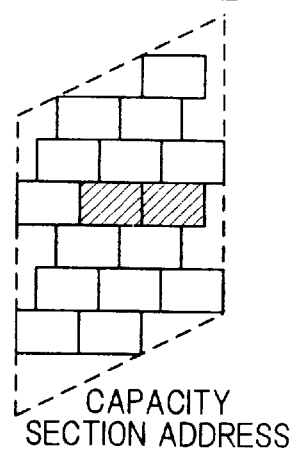

FIG. 6 is a diagram of a screen image in the case where the form of the memory cell array is parallelogrammic. Japanese Patent Laid-Open No. 17942/1996 proposes a semiconductor memory wherein bit lines are formed slantingly to word lines in order to reduce the area per cell in an open bit line system. In this case, the form of the memory cell array is parallelogrammic.

FIG. 6 (a) shows a physical address, and FIG. 6 (b) shows an address in an increased screen display in the address of the capacity section. This drawing shows a region of 8 word lines in the longitudinal direction and 4 lines (4 sense AMPs) in the lateral direction. Fail bits are displayed in a black color. Also in this case, in the case of display of the physical address only, it is difficult to note that in the array of the capacity section, adjacent cells are defective.

Figure 7A:
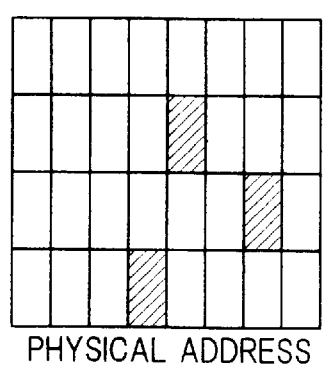
FIGS. 7A and 7B are a screen image diagram in an embodiment wherein the form of a memory cell array is honeycomb.
Figure 7B:
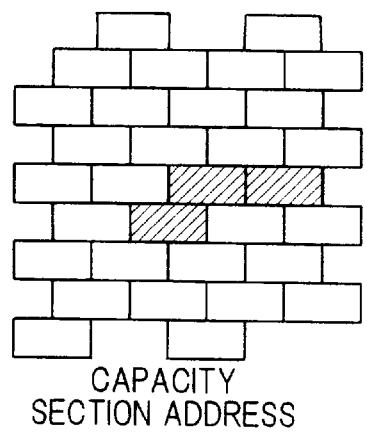

FIG. 7 is a diagram showing a screen image in the case where the form of the array of the capacity section is honeycomb. Japanese Patent Laid-Open No. 65872/1992 proposes a semiconductor memory wherein the memory cell is arrayed at one-fourth pitch in order to broaden the space of device region in the reflected bit line system. In this case, the array of the capacity section is honeycomb.

FIG. 7 (a) shows a physical address, and FIG. 7 (b) shows an image as an increased screen display in the address of the capacity section. This drawing shows a region of 8 word lines in the longitudinal direction and 8 lines (4 sense AMPs) in the lateral direction. Fail bits are displayed in a black color. As is apparent from the drawing, in the case of display of the physical address only, it is difficult to note that in the array of the capacity section, adjacent cells are defective.

Next, the second preferred embodiment of the invention will be explained with reference to accompanying drawings.

Also in the second preferred embodiment, the general construction of the positional information output device for LSI cells is the same as that in the first preferred embodiment and hence will be omitted.

Figure 8:
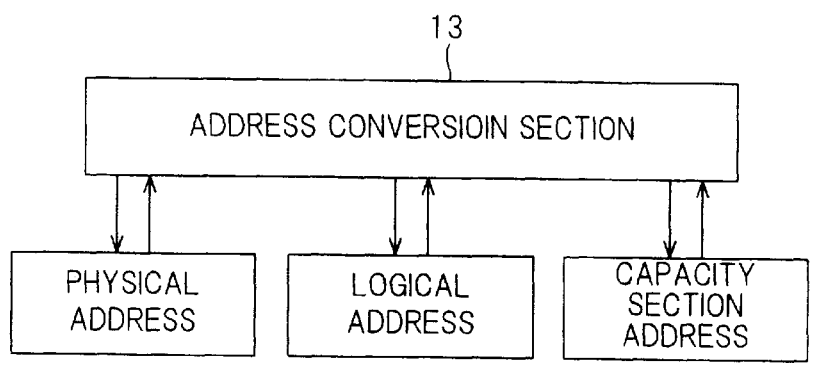
FIG. 8 is a schematic block diagram of a positional information output device for LSI cells according to a second preferred embodiment of the invention.

FIG. 8 is a functional block diagram illustrating the operation of an address conversion section 13 according to the second preferred embodiment of the invention.

According to the first preferred embodiment, three bit maps are previously prepared, stored and then displayed. On the other hand, according to the second preferred embodiment, only one bit map is prepared and stored, and address conversion is carried out for only a necessary portion. That is, according to the second preferred embodiment, only one bit map among the three bit maps should be stored, and the other addresses are calculated at the time of display on the screen. Use of this method can save the capacity of a memory and the capacity of a hard disk to about one-third of that in the case where this method is not used.

In the address conversion, as described above, it is necessary to previously provide formulae for mutual address conversion between different addresses. The address conversion is generally expressed by Boolean algebra. Therefore, it is generally difficult to determine a function of inverse conversion. For this reason, for example, when both the conversion from a physical address to a logical address and the conversion from a logical address to a physical address are necessary, the user should previously provide two address conversion formulae.

IEEE press, New York, pp. 186–189, 1990 describes a method wherein an internal unknown logical state in a combinational circuit is determined by repeating supposition and agree operation based on known logical states. This method as such cannot be applied to the positional information output device for LSI cells. However, it has been found that, in the invention, this method can be diverted to the determination of inverse conversion of the address conversion.

Specifically, rather than the determination of a true inverse function, a certain address is regarded as an output state, and an input address satisfying the output address is estimated. In this case, the inverse function is not determined, and, instead, a quasi-address for each output address can be determined. Here what is greatly different from the combinational circuit is that, in the case of the address conversion, that only one input address is determined is previously decided. This is because, in the case of address conversion, the input address:output address is necessarily 1:1.

According to the invention, use of an algorithm for estimating the input state from the output state in the combinational circuit can halve the preparation of address conversion formulae that requires hands.

Figure 9:
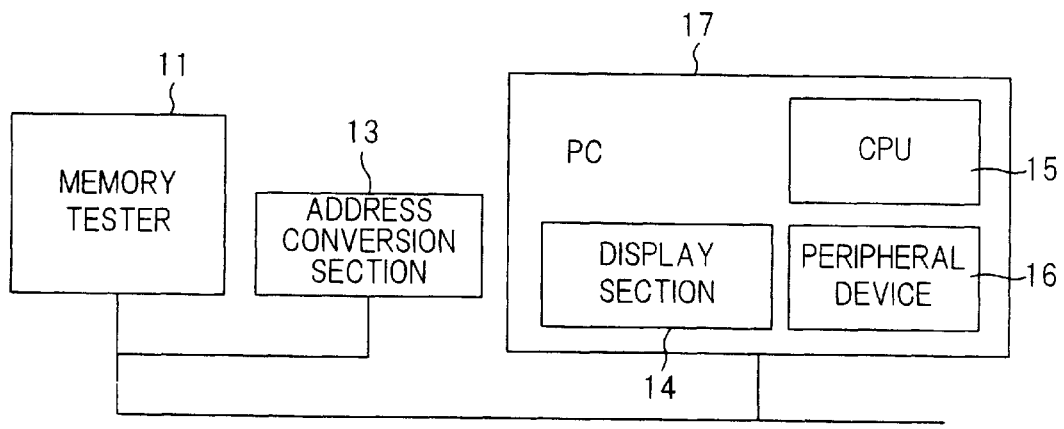
FIG. 9 is a schematic block diagram of a positional information output device for LSI cells according to a third preferred embodiment of the invention.

FIG. 9 is a schematic block diagram of the third preferred embodiment of the invention.

In this drawing, numeral 11 designates a memory tester, and numeral 17 PC (a personal computer) for analyzing information received from the memory tester 11. The third preferred embodiment is different from the first preferred embodiment in that the address conversion section 13 is provided as an independent system containing a circuit as a hardware.

The first and second preferred embodiments are disadvantageous in that a long processing time is necessary because the address conversion is carried out using a software. On the other hand, according to the third preferred embodiment, the use of a specialty hardware can realize high-speed address conversion. Therefore, the user can display a necessary bit map at a higher speed, leading to increased efficiency of fault analysis.

Thus, in displaying positional information on a fail cell or the like after a test on a semiconductor memory with a memory tester 11, the address conversion section 13 of PC 12 carries conversion to a plurality of types of address array information, i.e., a logical address and an address in a capacity section, based on the positional information obtained from the memory tester 11, and the display section 14 performs display based on the plurality of types of address array information. Therefore, the state of a fail cell can be easily understood, and the efficiency of the fault analysis can be improved.

As is apparent from the foregoing description, the invention can provide a positional information output device for LSI cells, a method for outputting the positional information, and a recording medium for a positional information output program for LSI cells that have the following effects.

Specifically, the fault analysis of a semiconductor memory can be carried out at a higher speed with a better accuracy, because several types of bit maps desired by the user may be output and displayed, enabling the state of a fail bit to be judged at a glance.

Further, the number of conversion formulae, which should be previously provided for address conversion of the bit map, can be reduced. The reason for this is as follows. The so-called "inverse conversion" can be previously automatically produced by means of a unidirectional conversion formula using an algorithm for estimating the input state from the output state in the combinational circuit. eliminating the need to previously provide the formulae for inverse conversion.

The invention has been described in detail with particular reference to preferred embodiments, but it will be understood that variations and modifications can be effected within the scope of the invention as set forth in the appended claims.

What is claimed is:

1. A positional information output device for LSI cells, adapted for outputting information on the position of a fail cell which has been found to be defective through an electrical test on a semiconductor memory, the output device comprising address conversion means for converting one address array information to other address array information, permitting the positional information on a cell to be output as a plurality of types of address array information.

2. The positional information output device for LSI cells according to claim 1, wherein the address conversion means converts cell information to address array information in a capacity section that stores cell information.

3. The positional information output device for LSI cells according to claim 2, wherein, in outputting the address array information in the capacity section storing the cell information, the address conversion means outputs address array information reflecting actual memory cell array form of the device.

4. The positional information output device for LSI cells according to claim 3, wherein the memory cell array form is parallelogrammic.

5. The positional information output device for LSI cells according to claim 3, wherein the memory cell array form is honeycomb.

6. The positional information output device for LSI cells according to claim 1, wherein the address conversion means automatically produces an address corresponding to inverse conversion from a unidirectional conversion formula for converting one address array information to other address array information.

7. The positional information output device for LSI cells according to claim 6, wherein, in the automatic production of the address corresponding to the inverse conversion, the address conversion means estimates an input state from the output state in an address conversion site.

8. The positional information output device for LSI cells according to claim 1, which further comprises display means for displaying a desired portion of a wafer in an increased or reduced screen based on the address array information.

9. The positional information output device for LSI cells according to claim 8, wherein the display means displays, in an array form, the desired portion of the wafer based on the plurality of types of address array information.

10. The positional information output device for LSI cells according to claim 1, wherein the semiconductor memory is DRAM using a reflected bit line system.

11. A method for outputting information for LSI cells on the position of a fail cell which has been found to be defective through an electrical test on a semiconductor memory, wherein one address array information is converted to other address array information to output the positional information on a cell as a plurality of types of address array information.

12. A recording medium recording a positional information output program, for LSI cells, for outputting information on the position of a fail cell which has been found to be defective through an electrical test on a semiconductor memory, the positional information output program comprising the steps of: converting one address array information to other address array information; and outputting the positional information on a cell as a plurality of types of address array information.

* * * * *